US006577133B1

United States Patent
Barron

(10) Patent No.: US 6,577,133 B1
(45) Date of Patent: Jun. 10, 2003

(54) INDUCTIVE MEASUREMENT OF ARMATURE TRAVEL WITHIN A SOLENOID VALVE

(75) Inventor: Richard J. Barron, Ann Arbor, MI (US)

(73) Assignee: Kelsey-Hayes Company, Livonia, MI (US)

( * ) Notice: Subject to any disclaimer, the term of this patent is extended or adjusted under 35 U.S.C. 154(b) by 0 days.

(21) Appl. No.: 09/951,084

(22) Filed: Sep. 12, 2001

Related U.S. Application Data

(63) Continuation of application No. 09/358,176, filed on Jul. 20, 1999, now abandoned.
(60) Provisional application No. 60/093,567, filed on Jul. 20, 1998, and provisional application No. 60/099,585, filed on Sep. 9, 1998.

(51) Int. Cl.[7] ........................ G01R 31/327; F02P 17/00; H01F 5/00
(52) U.S. Cl. .................. 324/415; 324/207.16; 324/389
(58) Field of Search ............................ 324/415, 207.16, 324/423, 389, 388, 546, 545, 547; 361/159, 187

(56) References Cited

U.S. PATENT DOCUMENTS

| | | | |
|---|---|---|---|
| 4,251,762 A | | 2/1981 | Williams |
| 4,319,193 A | | 3/1982 | Boccali et al. |
| 5,115,193 A | | 5/1992 | Bean et al. |
| 5,218,308 A | | 6/1993 | Bosebeck et al. |
| 5,289,131 A | | 2/1994 | Heidt et al. |
| 5,424,637 A | | 6/1995 | Oudyn et al. |
| 5,442,671 A | | 8/1995 | Wollschlager et al. |
| 5,578,904 A | * | 11/1996 | Marcott et al. ........ 324/207.16 |
| 5,583,434 A | | 12/1996 | Moyers et al. |
| 5,650,909 A | | 7/1997 | Remele et al. |
| 5,942,892 A | * | 8/1999 | Li ............................ 137/554 |

\* cited by examiner

*Primary Examiner*—Christine Oda
*Assistant Examiner*—James C. Kerveros
(74) *Attorney, Agent, or Firm*—MacMillan, Sobanski & Todd, LLC

(57) ABSTRACT

A test apparatus which having a window comparitor circuit which includes a coil. The coil is placed over a solenoid valve cartridge and switched on and off. The on time of the window comparitor circuit is measured to verify correct assembly of the solenoid valve cartridge.

18 Claims, 8 Drawing Sheets

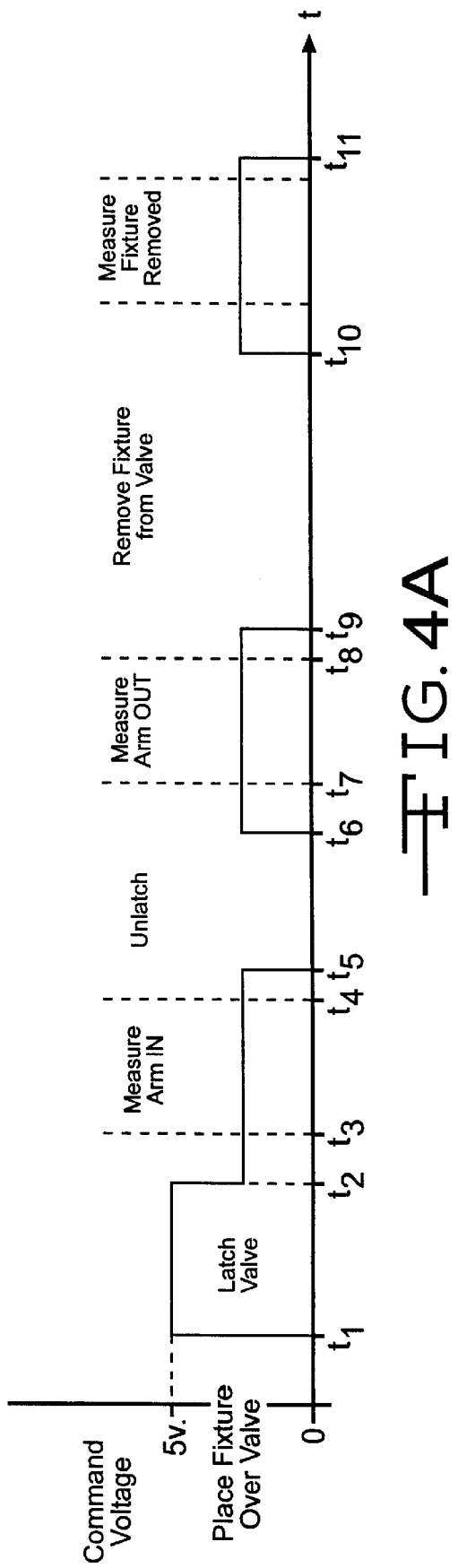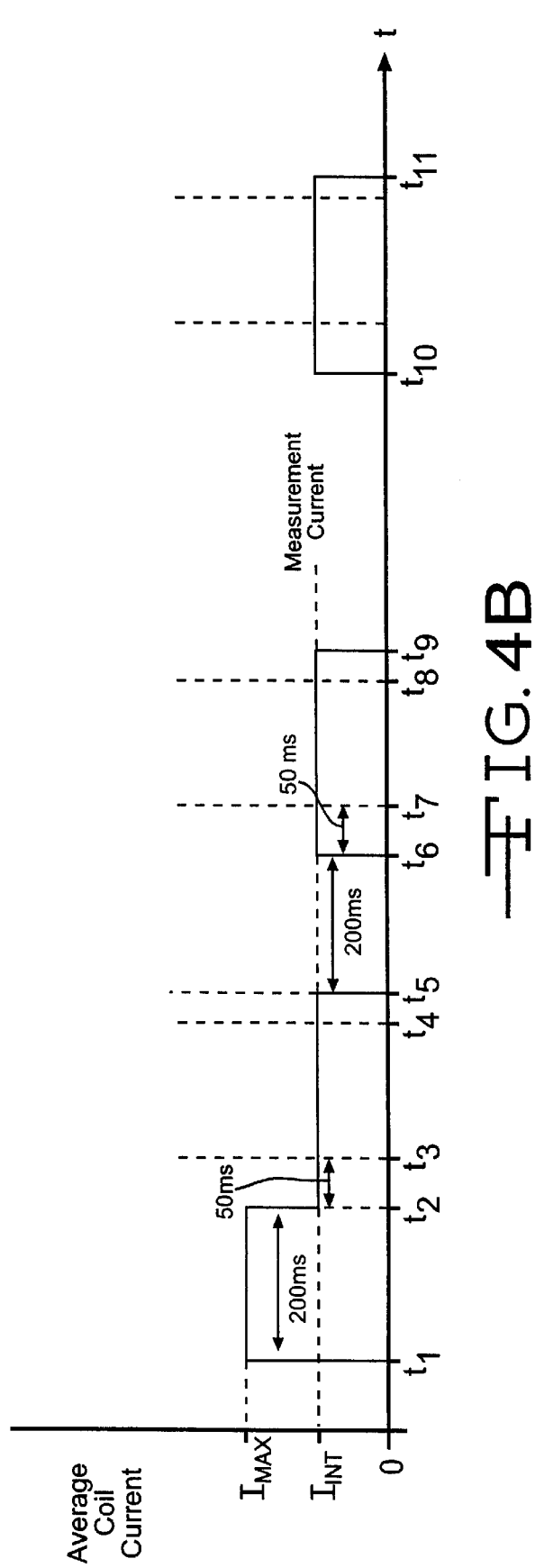

INDUCTIVE MEASUREMENT OF ARMATURE TRAVEL WITHIN A SOLENOID VALVE

CROSS REFERENCE TO RELATED APPLICATIONS

This is a continuation of U.S. patent application No. 09/358,176, filed on Jul. 20, 1999 now abandoned, and claims the benefit of U.S. Provisional Application No. 60/093,567, filed Jul. 20, 1998, and No. 60/099,585 filed on Sep. 9, 1998.

BACKGROUND OF THE INVENTION

This invention relates in general to solenoid valves utilized in anti-lock brake systems and in particular to measurement of the movement of an armature within a solenoid valve.

An anti-lock brake system (ABS) is often included as standard equipment on new vehicles. When actuated, the ABS is operative to control the operation of some or all of the vehicle wheel brakes. A typical ABS includes a plurality of normally open and normally closed solenoid valves which are mounted within a control valve body and connected to the vehicle hydraulic brake system. Usually, a separate hydraulic source, such as a motor driven pump, is included in the ABS for reapplying hydraulic pressure to the controlled wheel brakes during an ABS braking cycle. The pump is typically included within the control valve body while the pump motor is mounted upon the exterior of the control valve body.

An ABS further includes an electronic control module which has a microprocessor. The control module is electrically coupled to the pump motor, a plurality of solenoid coils associated with the solenoid valves and wheel speed sensors for monitoring the speed and deceleration of the controlled wheels. The control module is typically mounted upon the control valve body to form a compact unit which is often referred to as an ABS electro-hydraulic control unit.

During vehicle operation, the microprocessor in the ABS control module continuously receives speed signals from the wheel speed sensors. The microprocessor monitors the wheel speed signals for a potential wheel lock-up condition. When the vehicle brakes are applied and the microprocessor senses an impending wheel lock-up condition, the microprocessor is operative to actuate the pump motor and selectively operate the solenoid valves in the control unit to cyclically relieve and reapply hydraulic pressure to the controlled wheel brakes. The hydraulic pressure applied to the controlled wheel brakes is adjusted by the operation of the solenoid valves to limit wheel slippage to a safe level while continuing to produce adequate brake torque to decelerate the vehicle as desired by the driver.

As described above, an ABS typically includes a plurality of solenoid valves for controlling the flow of hydraulic fluid to the vehicle wheel brakes. Referring now to the drawings, there is shown generally at 10 a typical cartridge for a normally closed solenoid valve. In an ABS, such normally closed valves are typically referred to as "dump" valves. The valve cartridge 10 includes a generally cylindrical valve body 11. An inlet port, which includes a stepped bore 12, extends axially through the valve body 11. The upper end of the stepped bore 12 is formed into a valve seat 13. A pair of outlet ports 14 are also formed in the valve body 11.

A tubular valve sleeve 15 extends axially from the top of the valve body 11. An axially slidable armature 16 is disposed within the valve sleeve 15. A valve ball 17 is mounted upon the lower end of the armature 16. The valve ball 17 co-operates with the valve seat 13 to control the flow of fluid through the valve cartridge 10. A cylindrical core 18 is secured in the upper end of the valve sleeve 15. A return spring 19 is disposed between the lower end of the core 18 and the upper end of the armature 16. The return spring 19 urges the armature 16 in a downward direction in FIG. 1 to maintain the valve cartridge 10 in a normally closed position. As shown in FIG. 1, when the cartridge 10 is in its normally closed position, a small working air gap, which is labeled $G_A$, exists between the lower end of the core 18 and the upper end of the armature 16.

A dump valve also includes an annular flux ring and a solenoid coil (not shown) which slidingly extend axially over the valve sleeve 15 and core 18. The solenoid coil typically includes insulated magnet wire wound upon a plastic bobbin. A metal cup-shaped flux casing (not shown) encloses the coil and flux ring and is secured to the flux ring by a conventional operation, such as crimping to form a coil assembly. The flux casing and flux ring provide a return path for the magnetic flux when the solenoid valve is actuated. Typically, the coil assembly is attached to a Printed Circuit Board in the ABS control module and is removable from the valve cartridge 10 when the control module is removed for maintenance. When the coil assembly is removed, valve sleeve 15 maintains a sealed hydraulic brake circuit.

During operation, an electric current is passed through the solenoid coil. The resulting magnetic field causes the armature 16 to move in an axial upward direction within the valve sleeve 15 to compress the return spring 19. As the armature moves, the working air gap $G_A$ is closed and the valve ball 17 moves away from the valve seat 13 to open the solenoid valve. Upon the interruption of the electric current, the magnetic field collapses and the return spring 19 pushes the armature 16 in a downward axial direction to reset the valve ball 17 upon the valve seat 13 and thereby close the solenoid valve.

As indicated above, an ABS also includes normally open, or isolation, solenoid valves which have a structure similar to the dump valve described above. A cartridge for a typical isolation valve is illustrated in FIG. 7, where the working air gap $G_A$ exists between the lower end of the armature 16 and the upper end of the valve body 11.

SUMMARY OF THE INVENTION

This invention relates to measurement of the movement of an armature within a go solenoid valve.

As explained above, solenoid valves are important components in anti-lock brake systems. Therefore, it is desirable that such valves are properly assembled. For example, a manufacturer needs to confirm that a return spring has been included within each of the valves. Typically, the valve sleeve is press fit onto the valve body and secured with a laser weld. The axial position of the valve sleeve upon the valve body controls the working air gap between the valve armature and the valve core in a dump valve or the between the valve armature and valve body in an isolation valve. A typical working air gap has a tolerance of 0.004 inches. The size of the working air gap is especially critical in proportional solenoid valves.

It is known to test an assembled solenoid valve by removing the valve from its pallet and turning the valve over to expose a valve port formed through the valve seat. Such ports have a typical diameter of 0.013 inches. A slender test probe is inserted through the valve port and into contact with the valve ball mounted in the end of the valve armature. The test probe is connected to a Linear Variable Differential Transformer (LVDT). The solenoid coil for the valve is energized to axially displace the armature and test probe. The movement of the armature and the test probe, which is a function of the working air gap of the valve, is measured by the LVDT. The coil is then de-energized and the armature movement again measured by the LVDT. The test procedure confirms that the working air gap has the correct size and that a return spring has been included in the valve; however, the test is very time consuming and requires accurate placement of a delicate mechanical component. Accordingly, it would be desirable to provide a simpler method for measuring armature travel within a solenoid valve cartridge to verify correct assembly of the cartridge.

The present invention contemplates an apparatus for testing a solenoid valve cartridge which includes a coil adapted to be placed over the valve cartridge and a circuit for supplying an electric current to the coil. The circuit co-operates with the coil to form a window comparitor. The window comparitor switches the voltage applied to the coil on and off, with the voltage on time being a function of the inductance of the coil. The coil inductance is proportional to the size of the working air gap in the solenoid valve cartridge. Accordingly, the on time for the coil voltage is a function of the size of the working air gap of the solenoid valve cartridge.

The apparatus further includes a mechanism for positioning the coil over the solenoid valve cartridge before the current is supplied to the coil. The mechanism also removes the coil from the solenoid valve cartridge after the test is completed. The apparatus also can include a data logging device coupled to the circuit for recording the results of the test. The apparatus can additionally include a control unit coupled to the mechanism for positioning the coil over the solenoid valve cartridge. The control unit is also coupled to the circuit and is operative to actuate both the positioning mechanism and activate the circuit.

The invention further includes a method for testing a solenoid valve cartridge which includes providing a test fixture having a coil. The test fixture is placed over the solenoid valve cartridge being tested. The test fixture coil is energized and the duration of the on time for the voltage applied to the coil is observed. The duration of the voltage on time is then correlated with the size of the working air gap in the valve cartridge.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 2:
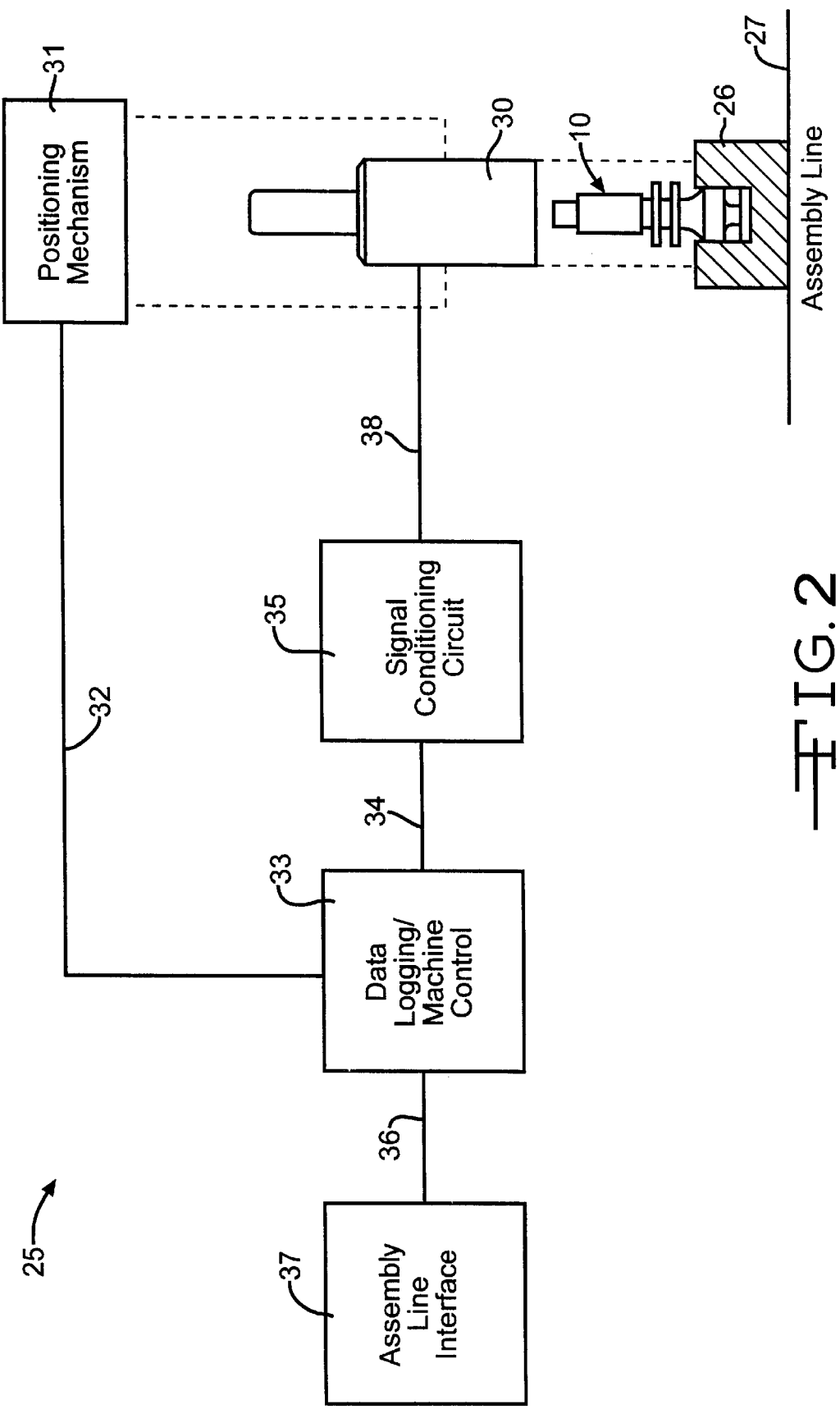
FIG. 2 is a block diagram of a test apparatus for the valve cartridge shown FIG. 1 which in accordance with the invention.

Referring again to the drawings, there is illustrated in FIG. 2 a block diagram for a test apparatus 25 for a solenoid valve cartridge 10 which is in accordance with the invention. The valve cartridge 10 is mounted upon by a pallet 26 which is carried by a solenoid valve assembly line 27. A test fixture 30 is suspended over the cartridge 10. The test fixture 30 is mounted upon a conventional positioning mechanism 31, which is indicated by a block and associated dashed lines in FIG. 2. The positioning mechanism 31 is operable to extend, or lower, the test fixture 30 over the valve cartridge 10 for testing thereof and then to retract, or raise, the test fixture 30 following completion of testing. The positioning mechanism 31 is electrically connected by a line 32 to a data logging and machine control device 33. The control device 33 also is electrically connected by a line 34 to a signal conditioning circuit 35, which will be described below, and by another line 36 to an assembly line interface 37. The signal conditioning circuit 35 is connected by a line 38 to the test fixture 15. While a single line is shown in FIG. 2 for the electrical connecting lines 32, 34, 26 and 38, it will be appreciated that a plurality of wires can be included in each of the lines and that bi-directional transmission of information is contemplated over the lines 32, 34, 26 and 38.

The operation of the test apparatus 25 will now be briefly described. The data logging and machine control device 33 is operative through the assembly line interface 37 to halt the assembly line 27 with a valve cartridge 10 positioned directly below the test fixture 30. The control device 33 then sends an extension signal through line 32 to the positioning mechanism 31. The positioning mechanism 31 is responsive to the extension signal to lower the test fixture 30 over the portion of the valve cartridge 10 which extends above the pallet 26. The control device 33 next activates the signal conditioning circuit 35 which, as will be described below, energizes the test fixture 30 to test the valve cartridge 10 for the correct air gap size and inclusion of a return spring. The results of the test are transmitted from the signal conditioning circuit 35 to the data logging and machine control device 33 which is operative, upon receiving the test results, to send a retract signal to the positioning mechanism 31. The positioning mechanism 31 is responsive to the retract signal to raise the test fixture 30 from the valve cartridge. Once the test fixture is clear of the cartridge 10, the control device 33 indexes the assembly line 27 to move the next valve cartridge (not shown) into position for testing.

It is contemplated that, in the preferred embodiment, the entire testing sequence will require less than three seconds per valve cartridge 10. Furthermore, the valve cartridge 10 does not have to be removed from the pallet 26 for testing. Accordingly, the apparatus 25 is expected to significantly reduce the testing time required for solenoid valves while also significantly lowering the testing costs.

Figure 1:
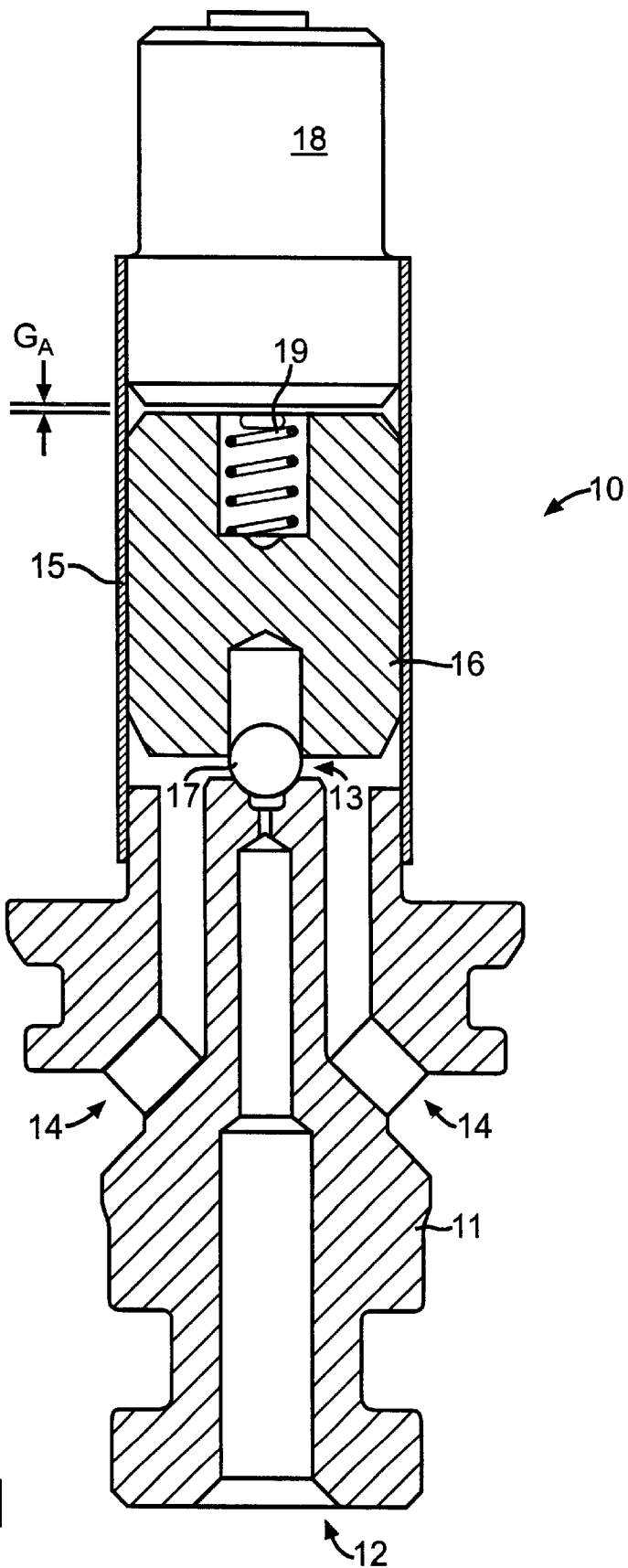
FIG. 1 is a sectional view of a prior art valve cartridge for a normally closed solenoid valve.
Figure 3:
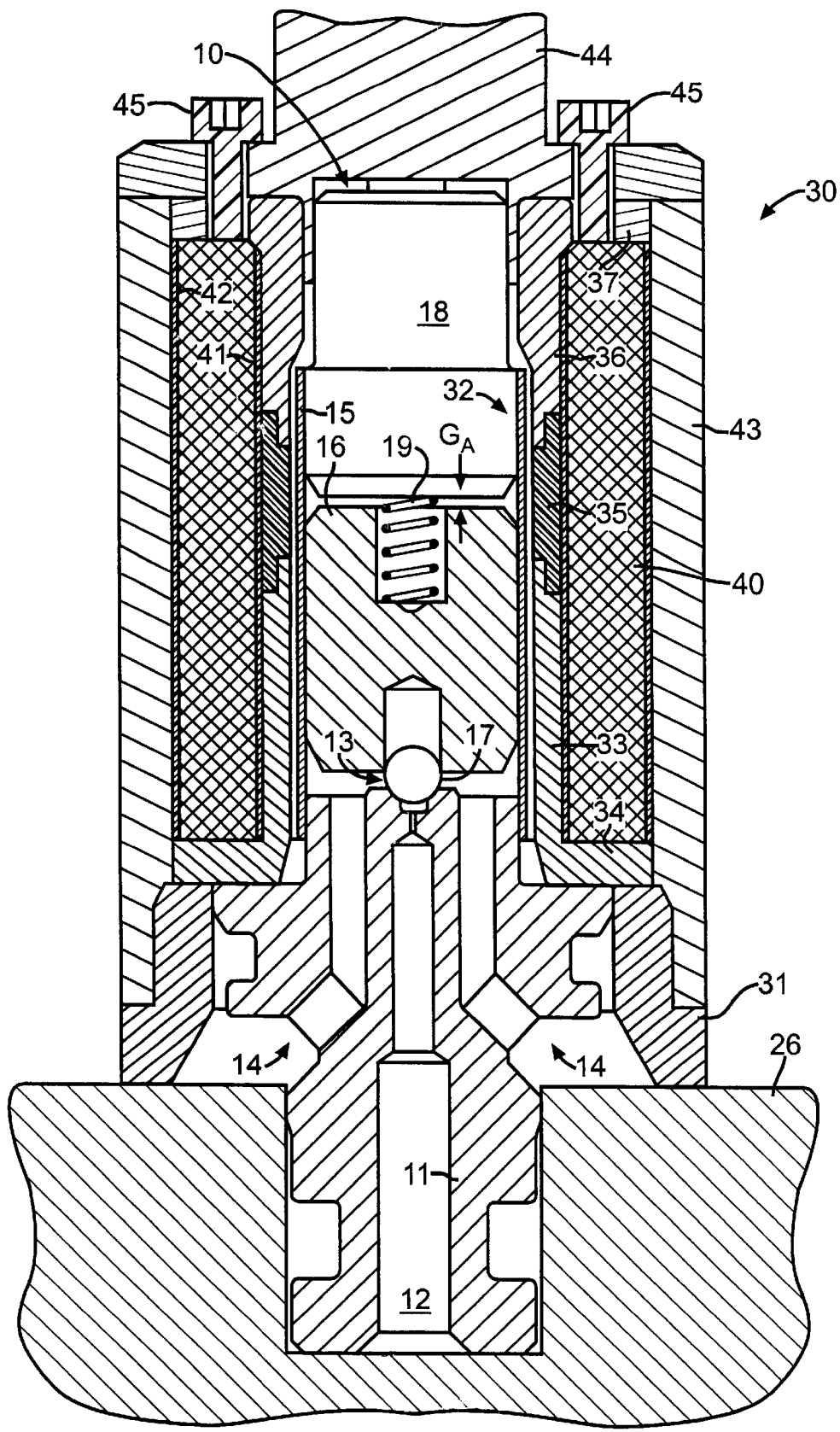
FIG. 3 is a sectional view of the test fixture shown in FIG. 2.

A sectional view of the test fixture 30 and dump valve cartridge 10 is illustrated in FIG. 3. The components of the dump valve cartridge 10 have the same numerical designators utilized in FIG. 1. As shown in FIG. 3, the test fixture 30 is extended over the dump valve cartridge 10 which is carried by the pallet 26. The test fixture 30 includes an annular base which forms an alignment collar 31. In the preferred embodiment, the alignment collar 31 is formed from a phenolic material; however, other materials also can be used to form the collar 31. The alignment collar 31 has a bore formed therethrough which includes a tapered lower end portion for guiding the test fixture 25 over the valve cartridge 10.

The alignment collar 31 carries a cylindrical flux tube 32 which is formed from three sections. A generally cylindrical lower section 33 of the flux tube 32 includes a radially extending lower flange 34 which is supported by the alignment collar 31. In the preferred embodiment, the lower section 33 is formed from a material having a lo high permeability, such as pure iron or silicon iron; however, other high permeability materials also can be used to form the lower section 33. The flux tube 32 also includes a tubular middle section 35 which is supported by the upper end of the lower section 33. In the preferred embodiment, the middle section 35 is formed from a non-magnetic material, such as a plastic, a glass filled nylon or a stainless steel alloy; however, other materials also can be used. The middle section 35 is positioned adjacent to the working air gap $A_G$. The middle section 35 supports, in turn, a generally cylindrical upper section 36 which has an upper end formed as a radially extending upper flange 37. In the preferred embodiment, the upper section 36 is formed from pure iron; however, other magnetic materials having a high permeability, such as stainless steel, also can be used to form the upper section 36. The upper and lower flanges 37 and 34 cooperate with the cylindrical portions of the flux tube 32 to form a coil bobbin.

A coil 40 is wound upon the flux tube 32. A pair of coil leads (not shown) extend to the signal conditioning circuit 35. A layer of Kapon electrically insulating tape 41 is disposed between the tube 32 and the coil 40 while a heat shrunk insulating layer 42 of an electrically insulating material encloses the outer surface of the coil 40. A tubular casing 43, which, in the preferred embodiment, is formed from pure iron, extends axially over the coil 40. An end cap 44, which, in the preferred embodiment, also is formed from pure iron, is attached to the upper end of the test fixture 30.

A pair of terminal plugs 45 extend through corresponding apertures formed through the end cap 44 and the upper bobbin flange 37. The terminal plugs 45 carry a pair of coil leads (not shown) through the end cap 44 and upper bobbin flange 37 for connection with the signal conditioning circuit 35 described below.

The coil 40 is designed to minimize reluctance changes in the magnetic circuit formed by the test fixture 30 and the valve cartridge 10 being tested other than the working air gap $G_A$ between the valve core 18 and the valve armature 16. In the preferred embodiment, the top of the valve core 18 contacts the test fixture end cap 44; however, there is a small air gap between the rest of the valve cartridge 10 and the flux tube 32. The lower flux tube section 33 has approximately twice the clearance with the valve sleeve 15 as would exist between a conventional flux ring and valve sleeve. This desensitizes the magnetic circuit to radial motion of the armature or cartridge during the test.

During a test, the coil 40 in the test fixture 30 is energized to move the armature 16 in the valve cartridge 10 being tested. The voltage, V, across the coil 40 is related to the current, i, flowing through the coil 40 by the following formula:

$$V = L(di/dt) + iR.$$

The above equation can be rearranged to solve for time as follows:

$$dt = L\, di/(V - iR).$$

The time required for the current to increase from a first current, $i_1$, to a second current, $i_2$, can be found by integrating the above equation, which yields:

$$t = -(L/R)\ln[(V - i_2 R)/(V - i_1 R)].$$

Once the test apparatus 25 has warmed up, the resistance R is fairly constant. Furthermore, the invention contemplates regulating the voltage V to a fairly constant value. The signal conditioning circuit 35 maintains a constant mean current, which effectively causes $i_1$ and $i_2$ to be the same. Accordingly, t is then a function of the inductance L of the coil 40. However, the inductance L is inversely proportional to the working air gap $G_A$ between the cartridge armature 16 and core 18. Therefore, the time t also is a function of the working air gap $G_A$.

The signal conditioning circuit 35 includes a window comparator which switches the voltage applied to the coil 40 on and off as the coil current fluctuates between $i_1$ and $i_2$, where $i_2$ is greater than $i_1$. When the coil current reaches $i_2$, the window comparitor switches off the coil voltage. The coil current begins to decay until the current reaches $i_1$, at which time the comparitor switches the coil voltage back on. Accordingly, the coil voltage oscillates between zero and a maximum value with the on time being the time required for the coil current to increase from $i_1$ to $i_2$. Thus, as described above, the on time for the voltage is directly related to the size of the working air gap $G_A$ of the valve cartridge 10 being tested.

The operation of the apparatus 25 during a test cycle of the valve cartridge 10 is illustrated by the figures shown in FIG. 4. At the beginning of the test cycle, the test fixture 30 is placed over the cartridge 10. The signal conditioning circuit 35 generates an average current which is directly proportional to a variable command voltage supplied to the conditioning circuit 35 by the data logging and machine control device 33. The signal conditioning circuit 35 functions as a current driver to the test fixture coil 40. The command voltage is varied during the test cycle as illustrated in FIG. 4A. As the command voltage is varied, the average current supplied to the test fixture coil follows.

The initial command voltage is selected to generate a sufficient average current, $I_{MAX}$, during the time period $t_1$ to $t_2$ to axially shift the armature 16 in an upward direction in FIG. 3 to a latched position with the working air gap $A_G$ closed. The average current supplied to the test fixture coil 40 by the signal conditioning circuit 35 is illustrated in FIG. 4B. Once the armature 16 has latched, the command voltage is reduced at $t_2$ to reduce the average coil current to an average intermediate value, $I_{INT}$, which holds the armature 16 in its latched position from $t_2$ to $t_3$, as shown in FIG. 4A. The intermediate current, $I_{INT}$, is chosen high enough that the armature 16 will not release from the force of the return spring 19. As will be explained below, the coil 40 also is energized later in the test cycle with the intermediate current after the valve cartridge is unlatched. Accordingly, the intermediate current, $I_{INT}$, is selected to be sufficiently low that the armature 16 also will not move against the return spring 19 after the armature 16 has returned to its de-energized position.

Figure 4C:
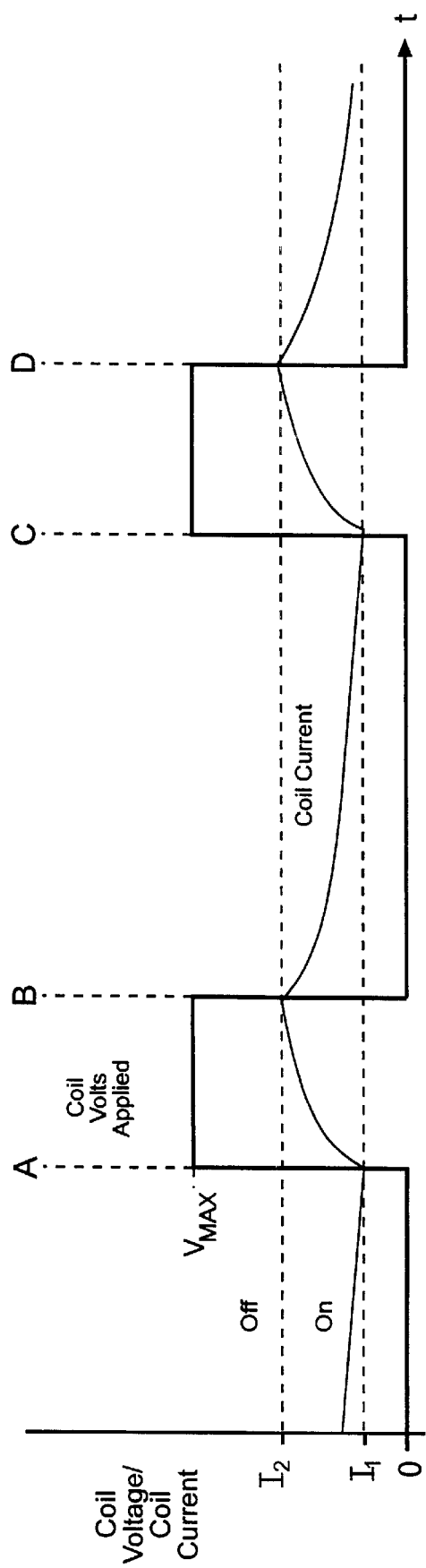
FIG. 4 illustrates typical waveforms resulting from the operation of the test apparatus shown in FIG. 2.

As explained above, the inductance of the coil 40 cooperates with the signal conditioning circuit 35 to form a window comparator. The window comparator establishes a window about the average current corresponding to the demand voltage. As described above, the comparator is operative during the measurement to switch the voltage applied to the coil 40 on when the current decays to a minimum value, $I_1$, and off when the current reaches a maximum value, $I_2$, as illustrated in FIG. 4C, where a portion of the current waveform shown in FIG. 4B is enlarged. Thus, the coil current oscillates between minimum and maximum values, $I_1$ and $I_2$, while the coil voltage switches between zero and a maximum value, $V_{MAX}$, which in the preferred embodiment is approximately 12 volts.

As described above, the duration of the on time for the voltage applied to the coil 40 is a function of the size of the working air gap of the valve cartridge 10 being tested. As shown in FIG. 4B, after a sufficient period of time has passed for the armature 16 to latch, which in the preferred embodiment is 200 milliseconds, the coil current is reduced at $t_2$. Following a short delay, which in the preferred embodiment is 50 milliseconds, the duration of the on time for the voltage applied to the test fixture coil 40 is measured to confirm that the armature 16 is fully latched. It will be noted that other typical time periods are shown in FIG. 4B; however, it will be appreciated that the time periods shown are intended to be exemplary and that the invention also can be practiced utilizing other time periods than those shown in FIG. 4B. In the preferred embodiment, the measurement extends over a predetermined time period from $t_3$ to $t_4$ and an average time period for the voltage on times measured over the predetermined time period is calculated. The average on time is correlated to the working air gap size. If the average on time period is outside of an expected range of values, the condition is indicative of the armature 16 not being latched or the air gap $A_G$ being incorrectly sized due to a manufacturing error.

For a particular command voltage, the on time of the coil voltage will vary as a function of the armature position. Conversely, a measurement of the voltage on time is indicative of the armature position. To illustrate the relationship between the working air gap $A_G$ and signal conditioning circuit 35, the following table lists typical voltage on time periods as a function of the valve cartridge armature position for the voltage curve shown in FIG. 4C:

| Armature Position | Voltage On Time - $T_{(A-B)}$ |
| --- | --- |
| Latched | 580–600 microseconds |
| Unlatched | 400–430 microseconds |
| Valve Cartridge Removed | 183 microseconds |

While the preferred embodiment of the invention has been illustrated and described with the coil voltage on time being measured, it will be appreciated that the invention also can be practiced by measuring the coil voltage off time, the period or the frequency of the coil voltage which also can be correlated to the armature position.

Following the latched armature measurement, the command voltage is reduced to zero at $t_5$ to allow the armature 16 to return to its unlatched position. After a sufficient period of time, which is 200 milliseconds for the preferred embodiment, has passed for the armature 16 to unlatch, the test fixture coil 40 is re-energized at $t_6$ at the intermediate average current level, $I_{INT}$. Following a short delay, which is 50 milliseconds in the preferred embodiment, the on time of the coil voltage is measured at $t_7$ to confirm that the armature 16 is fully unlatched. As before, the measurement extends over a predetermined time period from $t_7$ to $t_8$ and an average time period for the voltage on times measured over the predetermined time period is calculated. If the coil voltage on time is outside of an expected range of values, the condition is indicative that the armature 16 did not return to the unlatched position, which could be due to the return spring 19 being omitted during the manufacturing process. Once the unlatched armature measurement is completed, the coil is de-energized at $t_9$ by reducing the applied voltage to zero. The test fixture 30 is then withdrawn from the valve cartridge 10.

In the preferred embodiment, the test fixture coil 40 is again energized from $t_{10}$ to $t_{11}$ with the intermediate current level, $I_{INT}$, and an average coil voltage on time is measured over a predetermined time period to verify that the test fixture 30 has cleared the valve cartridge 10 being tested. Upon verification that the test fixture 30 is clear, the assembly line 27 is indexed to move the next valve cartridge into position for testing. The data obtained during this part of the test cycle also can be used to calibrate the test apparatus 25.

The results of the test cycle are logged by the data logging and machine control device 33. Any incorrectly assembled valve cartridges are identified and removed from the pallet 26. The invention further contemplates that the apparatus 25 marks the faulty valve cartridges to facilitate their removal; however, this step is optional. Similarly, the apparatus 25 could display a message and/or sound an alarm to alert an operator of an improperly assembled valve cartridge; however, these features also are optional.

Figure 5:
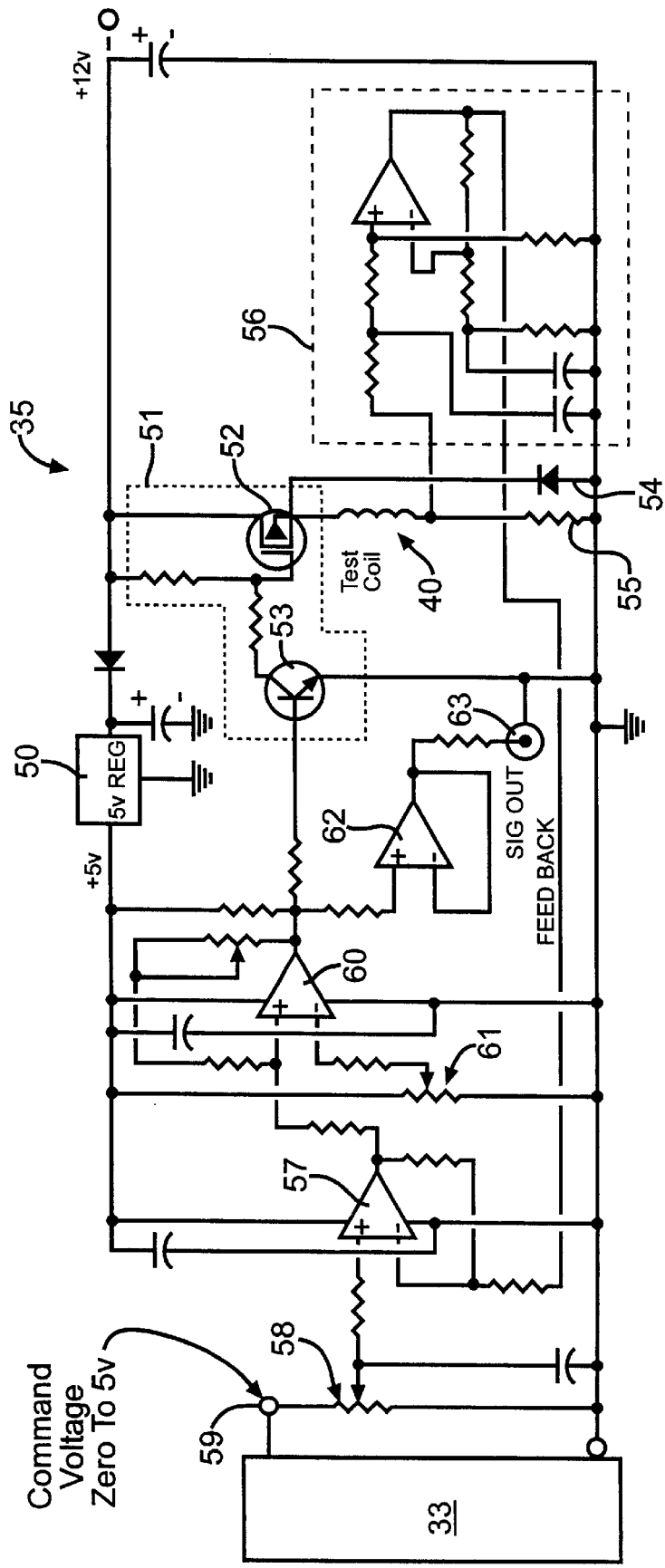
FIG. 5 is a schematic diagram of a test circuit which is included in the test apparatus shown in FIG. 2.

As described above, the apparatus 25 includes a signal conditioning circuit 35 which is illustrated by the schematic diagram shown in FIG. 5. The signal conditioning circuit 35 includes a voltage regulator 50 which converts 12 volts from a vehicle power supply to a regulated five volts for the circuit components. The circuit 35 also includes a switching circuit 51 which is connected between the 12 volt vehicle power supply and the test fixture coil 40. The switching circuit 51 includes a MOSFET 52 which is switched between its conducting and non-conducting states by a driver transistor 53. The MOSFET 52 has a drain terminal connected to the 12 volt vehicle power supply and a source terminal connected to one end of the test fixture coil 40. The signal conditioning circuit also includes a flyback diode 54 connected to the drain terminal of the MOSFET 52. The flyback diode 54 provides a path for the current flowing through the test fixture coil 40 when the MOSFET 52 switches from its conducting state to its non-conducting state.

A current sensing resistor 55 is connected between the other end of the test fixture coil 40 and ground. The voltage across the current sensing resistor 55, which is proportional to the current flowing through the test fixture coil 40, is applied to a conventional feedback amplifier and filter 56. The resulting amplified feedback voltage is applied to the negative input terminal of a first operational amplifier 57. A first potentiometer 58 is connected between the positive input terminal of the first operational amplifier 57 and an output terminal 59 of the machine control device 33. The variable command voltage for the signal conditioning circuit 35 appears at the machine control device output terminal 59. In the preferred embodiment, the command voltage can vary from zero to five volts. The command voltage is scaled by the first potentiometer 58. The first operational amplifier 57 generates an error signal which is a function of the difference between the command voltage and the feedback voltage.

The error signal output from the first operational amplifier 57 is applied to the positive input terminal of a comparator 60 which is configured to include switching hysterisis. A second potentiometer 61 supplies a variable regulated voltage to the negative input terminal of the comparator 60. The second potentiometer 61 allows adjustment of the comparator window width. The output from the comparator 60 drives the MOSFET 52 through the driver transistor 53. A power diode 61 connected across the test fixture coil 40 dissipates the energy within the coil 40 when the MOSFET 52 is switched off.

The circuit 35 cooperates with the test fixture coil 40 to form a window comparator while the first operational amplifier 57 cooperates with the comparator 60 to form a current driver for the test fixture coil 40. As explained above, the window comparator varies the coil current about an average value while switching the voltage applied to the test fixture coil 40 on and off. The voltage on time is a function of the inductance L of the coil 40. Furthermore, the inductance L of the coil 40, in turn, is a function of the size of the working air gap $G_A$ of the test cartridge 10. Accordingly, the voltage on time is directly related to the size of the working air gap $G_A$.

A buffer amplifier 62 connects the output of the comparator 60 to a data output terminal 63 of the signal conditioning circuit 35. The data output terminal 63 is connected to a data input port (not shown) on the data logging and machine control by device 33. The control device 33 determines the average duration of the voltage on time and correlates the average duration with the size of the working air gap $A_G$.

Figure 6:
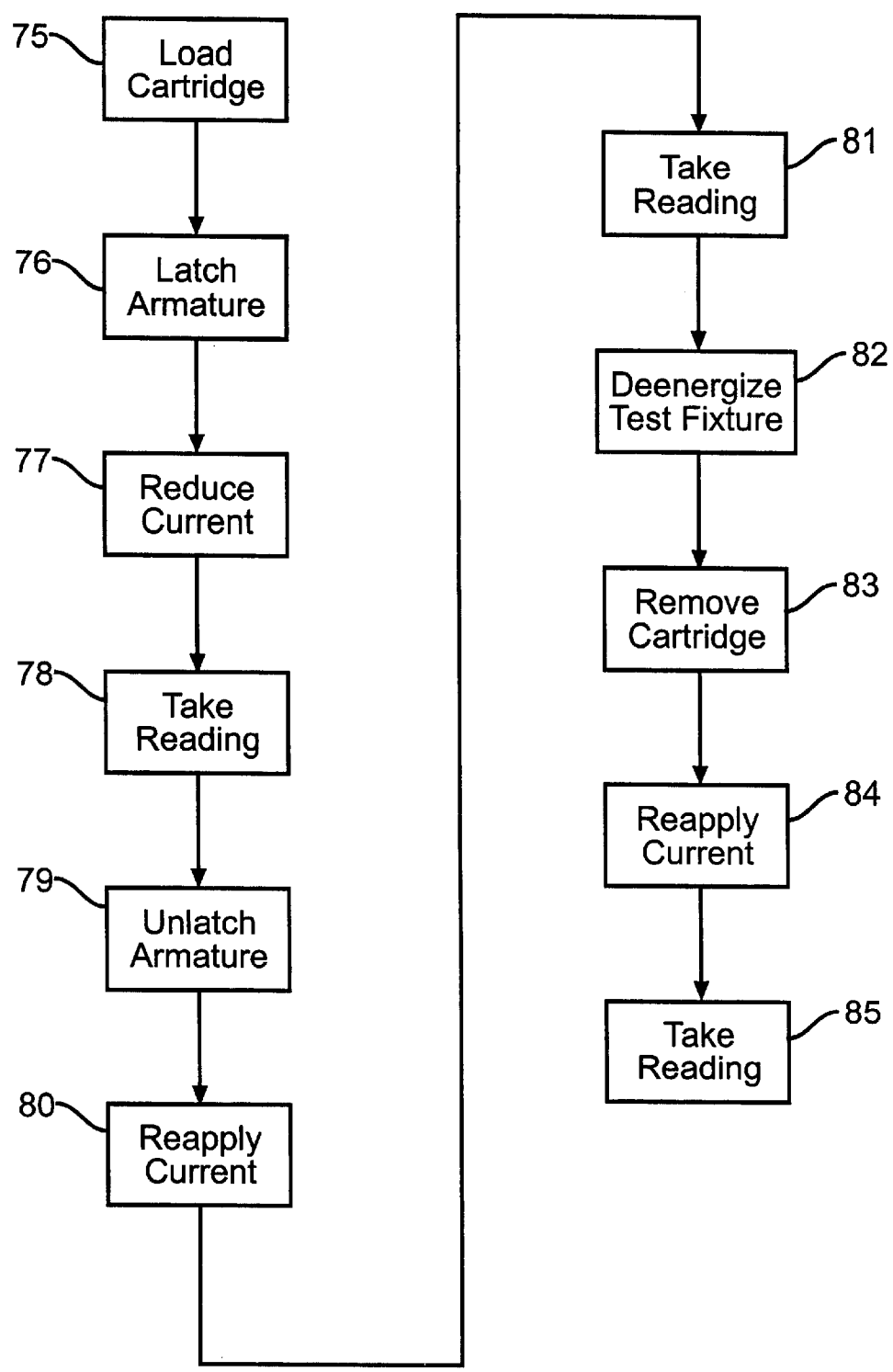
FIG. 6 is a flow chart for a test procedure which utilizes the test fixture shown in FIG. 2.

The present invention also contemplates a method for testing a solenoid valve cartridge. The method is illustrated by the flow chart shown in FIG. 6. In functional block 75 a valve cartridge is loaded into the test fixture. The test fixture coil is energized in functional block 76 to latch the solenoid armature. The current to the coil is reduced in functional block 77, following which a reading of the voltage on time is taken in functional block 79 to confirm that a cartridge is actually loaded in the test fixture and, if loaded, functioning properly. The coil is then de-energized in functional block 79 to unlatch the armature. Current is reapplied to the test fixture coil in functional block 80 for a second portion of the test. A second reading is taken in functional block 81 to confirm that the armature unlatched. Since the working air gap in a properly functioning cartridge will be larger during the test in functional block 81 than during the first portion of the test in functional block 78, the duration of the voltage on time will be different from the reading taken in functional block 78 to confirm proper operation of the cartridge. The coil is again de-energized in functional block 82 and the cartridge removed from the test fixture in functional block 83. The current is applied a third time to the test fixture coil in functional block 84 and a third reading is taken in functional block 85. The third reading confirms that the valve cartridge has actually been removed from the test fixture while also providing data for calibrating the signal conditioning circuit.

Figure 7:
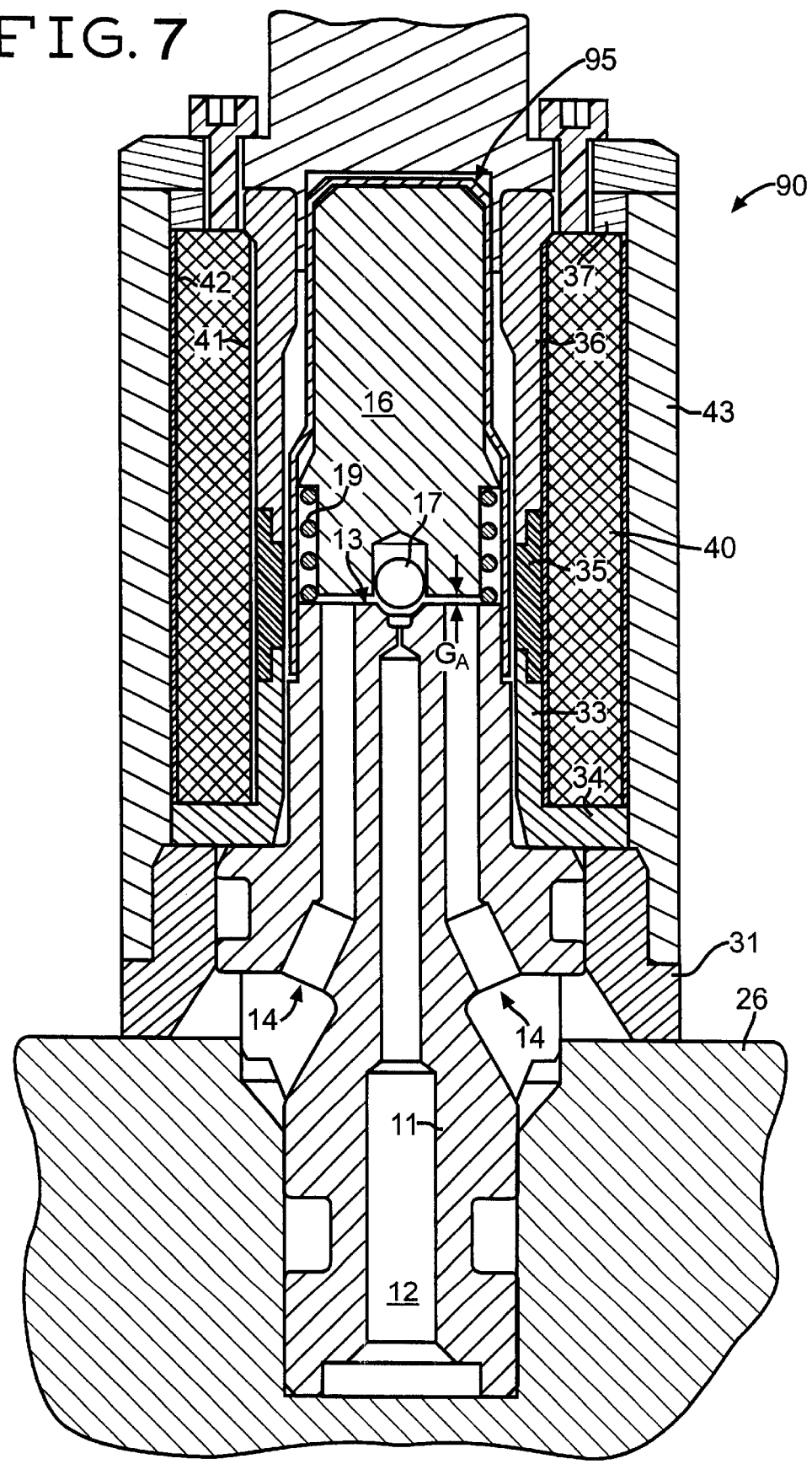
FIG. 7 is a sectional view of an alternate embodiment of the test fixture shown in FIG. 2 which is used to test valve cartridges for normally open solenoid valves.

The invention further contemplates an alternate embodiment of the test fixture 90, which is illustrated in FIG. 7, for testing a normally open valve cartridge 95, which also is illustrated in FIG. 7. Components shown in FIG. 7 which are similar to components shown in FIG. 3 have the same numerical designators. The normally open valve cartridge 95 would be included in an isolation valve (not shown) and includes a working air gap $A_G$ which is between the armature 16 and valve seat 13. Additionally, the spring 19 urges the armature 16 away from the valve seat 13 to open or unlatch the cartridge when the solenoid coil is not energized. Otherwise, the operation of the test apparatus is the same as described above.

The test fixture 90 is designed to be mounted upon the positioning mechanism 31 of the test apparatus 25. Accordingly, the invention contemplates that the simple replacement of one test fixture with another and a recalibration of the signal conditioning circuit will convert the test apparatus 25 to test a valve cartridge having a different structure. Thus, a plurality of different valve cartridges can be tested on essentially the same test apparatus, reducing test equipment costs.

While the preferred embodiment of the test fixture 30 has been illustrated and described above as including a single coil 40, it will be appreciated that the invention also can be practiced with a test fixture which includes two coils (not shown). It is contemplated that a first coil would be used to actuate the valve cartridge while a second coil would be connected to the signal conditioning circuit for sensing the valve armature movement.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. An apparatus for testing a solenoid valve cartridge having a magnetic circuit that includes a stationary portion and a moveable armature, the apparatus for testing comprising:

a test coil adapted to be placed over the solenoid valve cartridge, said test coil having a first end and a second end;

a current sensing resistor connected to said first end of said coil;

a switching device having first and second terminals and a control port, said switching device being responsive to a voltage applied to said control port to be in one of a conducting state and a non-conducting state between said first and second terminals, said switching device first terminal being connected to said second end of said test coil;

a power supply connected to said switching device second terminal;

a control circuit having an output terminal connected to said switching device control port, said control circuit also having input terminals connected across said current sensing resistor, said control circuit co-operating with said test coil to form an oscillatory circuit that applies an oscillating voltage to said switching device control port, said switching device being responsive to said oscillating voltage to be in a conducting state when the current through said current sensing resistor falls below a first predetermined value, and to be in a non-conducting state when the current through said current sensing resistor exceeds a second predetermined value that is greater that said first predetermined value, the switching device applying a pulsed voltage to said test coil with the on time of the voltage pulses being a function of the length of a working air gap between the stationary part and the movable armature in the magnetic circuit of the solenoid valve cartridge; and a measuring device connected to said control circuit, said measuring device operative to determine the average on time of the voltage pulses applied to the test coil and to correlate said average pulse on time to the size of the working air gap to provide an indication of proper operation of the solenoid valve cartridge.

2. An apparatus according to claim 1 wherein said test coil inductance is proportional to said working air gap in the solenoid valve cartridge.

3. An apparatus according to claim 2 wherein said test coil includes a winding wound upon a bobbin having a central bore, said bore adapted to be placed over a portion of the solenoid valve cartridge.

4. An apparatus according to claim 3 wherein said bobbin includes end portions formed from a magnetic material and a central portion disposed between said end portions, said central portion being formed from a non-magnetic material.

5. An apparatus according to claim 2 further including a mechanism adapted to position said test coil over the solenoid valve cartridge before said current is supplied to said coil and for removing said test apparatus coil from the solenoid valve cartridge after the test is completed.

6. An apparatus according to claim 5 further including a control unit coupled to said mechanism adapted to position said test coil over the solenoid valve cartridge, said mechanism also coupled to said oscillatory circuit, said control unit operative to actuate said mechanism adapted to position said test coil over the solenoid valve cartridge and to activate said control circuit.

7. An apparatus according to claim 6 wherein said measuring device includes a data logging device for recording the results of said test coupled to said oscillatory circuit.

8. An apparatus according to claim 2 further including a calculation based upon measurement of one of the rise time and the fall time of the current through said current sensing resistor to determine a measurement value for linear travel of said armature in the solenoid valve cartridge.

9. An apparatus according to claim 8 wherein the measured armature travel of the valve cartridge is compared to a specified parameter and further wherein any valve cartridges that do not satisfy said specified parameter are rejected.

10. An apparatus according to claim 2 further including a calculation based upon measurement of the rise time and the fall time of the current through said current sensing resistor to determine a measurement value for linear travel of said armature in the solenoid valve cartridge.

11. A method for testing a solenoid valve cartridge having a magnetic circuit that includes a stationary portion and a movable armature, the method comprising the steps of:

(a) providing a test apparatus that includes a test coil that is adapted to be placed over the solenoid valve cartridge and that has a first end connected to a current sensing resistor and a second end connected through a switching device to a power supply with the current sensing resistor connected to a control circuit for the switching device, the control circuit cooperating with the test coil to form a oscillatory circuit that applies an oscillating voltage to the switching device, the switching device being responsive to the oscillating voltage to be in a conducting state when the current through the current sensing resistor falls below a first predetermined value, and to be in a non-conducting state when the current through the current sensing resistor exceeds a second predetermined value that is greater than said first predetermined value, the switching device applying a pulsed voltage to the test coil with the on time of the voltage pulses being a function of the length of a working air gap between the stationary part and the movable armature in the magnetic circuit of the solenoid valve cartridge;

(b) placing the test coil over the solenoid valve cartridge;

(c) energizing the test coil; and (d) measuring said on time of the voltage pulses applied to the test coil whereby valve armature movement to a latched position is verified.

12. A method according to claim 11 further including, subsequent to step (d), de-energizing the test coil and then removing the test coil from the solenoid valve cartridge.

13. A method according to claim 11 wherein step (c) includes initially supplying sufficient current to the test apparatus coil to latch the valve cartridge and then reducing the current level before step (d) to a level sufficient to retain the latched condition of the cartridge.

14. A method according to claim 13 further including, subsequent to step (d), the following steps:

(e) de-energizing the test apparatus coil to unlatch the valve cartridge;

(f) re-energizing the test apparatus coil with a current level which is less than a current level needed to latch the valve cartridge; and (g) observing the duration of the on time of the voltage pulses applied to the test coil applied to the test apparatus coil to verify that the armature has moved to its unlatched position.

15. A method according to claim 14 further including, subsequent to step (g), the following steps:

(h) de-energizing the test apparatus coil;

(i) removing the test apparatus coil from the solenoid valve cartridge;

j) re-energizing the test apparatus coil; and (k) observing the duration of the on time of the voltage pulses applied to the test coil to verify that the test apparatus coil has been removed from the valve cartridge.

16. A method according to claim 11 further including a calculation based upon measurement of one of the rise time and the fall time of the current through the current sensing resistor to determine a measurement value for linear travel of said armature in the solenoid valve cartridge.

17. A method according to claim 16 wherein the measured armature travel of the valve cartridge is compared to a specified parameter and further wherein any valve cartridges that do not satisfy said specified parameter are rejected.

18. A method according to claim 11 further including a calculation based upon measurement of the rise time and the fall time of the current through the current sensing resistor to determine a measurement value for linear travel of said armature in the solenoid valve cartridge.

* * * * *